US010892724B2

(12) United States Patent
Cadotte, Jr.

(10) Patent No.: US 10,892,724 B2
(45) Date of Patent: Jan. 12, 2021

(54) WIDEBAND DISTRIBUTED POWER AMPLIFIERS AND SYSTEMS AND METHODS THEREOF

(71) Applicant: Lockheed Martin Corporation, Bethesda, MD (US)

(72) Inventor: Roland Cadotte, Jr., Freehold, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 16/260,784

(22) Filed: Jan. 29, 2019

(65) Prior Publication Data

US 2020/0244240 A1 Jul. 30, 2020

(51) Int. Cl.
| | | |
|---|---|---|
| *H03F 1/07* | (2006.01) | |
| *H03F 3/60* | (2006.01) | |
| *H03F 1/02* | (2006.01) | |
| *H03F 3/21* | (2006.01) | |
| *H03F 3/193* | (2006.01) | |
| *H03F 1/56* | (2006.01) | |

(52) U.S. Cl.
CPC ............ *H03F 3/607* (2013.01); *H03F 1/0288* (2013.01); *H03F 1/56* (2013.01); *H03F 3/193* (2013.01); *H03F 3/211* (2013.01)

(58) Field of Classification Search
CPC ................................. H03F 1/07; H03F 1/0288
USPC ............................................. 330/295, 124 R
See application file for complete search history.

(56) References Cited

U.S. PATENT DOCUMENTS

| | | | | |
|---|---|---|---|---|
| 8,134,409 B2* | 3/2012 | Seki | ...................... | H03F 1/0205 330/124 R |
| 8,354,882 B2* | 1/2013 | Blednov | ............... | H03F 1/0288 330/124 R |
| 2010/0001802 A1* | 1/2010 | Blednov | ............... | H03F 1/0288 330/295 |
| 2013/0293309 A1* | 11/2013 | Tamura | ..................... | H03F 3/68 330/295 |

(Continued)

OTHER PUBLICATIONS

Gassmann, J., et al., "Wideband, High-Efficiency GaN Power Amplifiers Utilizing a Non-Uniform Distributed Topology", pp. 615-618, IEEE, 2007.

(Continued)

*Primary Examiner* — Henry Choe
(74) *Attorney, Agent, or Firm* — Michael Best & Friedrich LLP

(57) ABSTRACT

A distributed power amplifier includes radio frequency (RF) input and output terminals. A first field effect transistor (FET) is coupled at a first gate terminal to the RF input terminal and at a first drain terminal to the RF output terminal. The first FET has a first periphery and a first source terminal electrically connected to ground potential. A second FET has a second periphery smaller than the first periphery. The second FET has a second gate terminal electrically coupled to the first gate terminal through a first inductor, a second drain terminal electrically coupled to the first drain terminal through a second inductor, and a second source terminal electrically connected to the ground potential. A drain voltage terminal, which excludes a resistive element, is electrically coupled to a drain bias network through which a drain bias voltage is applied to the first drain terminal and the second drain terminal.

20 Claims, 5 Drawing Sheets

(56) References Cited

U.S. PATENT DOCUMENTS

2014/0347133 A1* 11/2014 Qureshi .................. H03F 3/193
330/295

OTHER PUBLICATIONS

Campbell, Charles, et al., "A Wideband Power Amplifier MMIC Utilizing GaN on SiC HEMT Technology", IEEE Journal of Solid-State Circuits, vol. 44, No. 10, Oct. 2009 (8 pgs).
Cadotte, Roland, High PAE GaN Non-Uniform Distributed Amplifier, paper submitted to Tri-Service Radar Symposium on Jan. 29, 2018 (3 pgs).

* cited by examiner

WIDEBAND DISTRIBUTED POWER AMPLIFIERS AND SYSTEMS AND METHODS THEREOF

BACKGROUND

A High Power Amplifier (HPA) can be a key component in radar systems and other systems that require amplification of radio frequency (RF) signals. Power added efficiency (PAE) can be a key attribute of the HPA and can be limited for wideband amplifier designs. Wideband communication and radar systems may have numerous benefits over narrow band systems; however, their electrical performance is typically less than that of narrow band systems because of reduced performance of their wideband components.

Output match and susceptibility to load pull may also be a key concern for wideband systems. Typically, isolators are used to electrically isolate an HPA from the antenna. However, over wide bandwidths, isolators may not be available, causing the HPA's performance to be pulled by the antennae's changing and often poor input impedance.

A wideband HPA that has PAE approaching that of a narrow band HPA would be extremely beneficial to wideband communication and radar systems.

SUMMARY

A distributed power amplifier includes a radio frequency (RF) input terminal and an RF output terminal. A first field effect transistor (FET) is coupled at a first gate terminal thereof to the RF input terminal, and coupled at a first drain terminal thereof to the RF output terminal. The first FET has a first periphery and a first source terminal electrically connected to ground potential. A second FET is included and has a second periphery that is smaller than the first periphery of the first FET. The second FET has a second gate terminal electrically coupled to the first gate terminal through a first inductor, a second drain terminal electrically coupled to the first drain terminal through a second inductor, and a second source terminal electrically connected to the ground potential. A drain voltage terminal is electrically coupled to a drain bias network through which a drain bias voltage is applied to the first drain terminal and the second drain terminal. The drain bias network excludes a resistive element.

In another aspect, an apparatus for transmitting a radio frequency signal includes a waveform generator to generate the radio frequency signal. An antenna element emits the radio frequency signal. A distributed power amplifier is configured to amplify the radio frequency signal. The distributed power amplifier includes a radio frequency (RF) input terminal and an RF output terminal, a first field effect transistor (FET) coupled at a first gate terminal thereof to the RF input terminal, and coupled at a first drain terminal thereof to the RF output terminal, the first FET having a first periphery and a first source terminal electrically connected to ground potential. A second FET of the distributed power amplifier has a second periphery that is smaller than the first periphery, and has a second gate terminal electrically coupled to the first gate terminal through a first inductor, a second drain terminal electrically coupled to the first drain terminal through a second inductor, and a second source terminal electrically connected to the ground potential. The distributed power amplifier includes a drain voltage terminal electrically coupled to a drain bias network through which a drain bias voltage is applied to the first drain terminal and the second drain terminal. The drain bias network excludes a resistive element.

In another aspect, a method includes providing an apparatus for transmitting a radio frequency signal, and operating the apparatus to transmit the radio frequency signal. The apparatus includes a waveform generator to generate the radio frequency signal, an antenna element to emit the radio frequency signal, and a distributed power amplifier configured to amplify the radio frequency signal. The distributed power amplifier includes a radio frequency (RF) input terminal, an RF output terminal, a first field effect transistor (FET) coupled at a first gate terminal thereof to the RF input terminal, and coupled at a first drain terminal thereof to the RF output terminal, the first FET having a first periphery and a first source terminal electrically connected to ground potential. A second FET of the distributed power amplifier has a second periphery that is smaller than the first periphery, and has a second gate terminal electrically coupled to the first gate terminal through a first inductor, a second drain terminal electrically coupled to the first drain terminal through a second inductor, and a second source terminal electrically connected to the ground potential. The distributed power amplifier includes a drain voltage terminal electrically coupled to a drain bias network through which a drain bias voltage is applied to the first drain terminal and the second drain terminal. The drain bias network excludes a resistive element.

DETAILED DESCRIPTION

Figure 1:
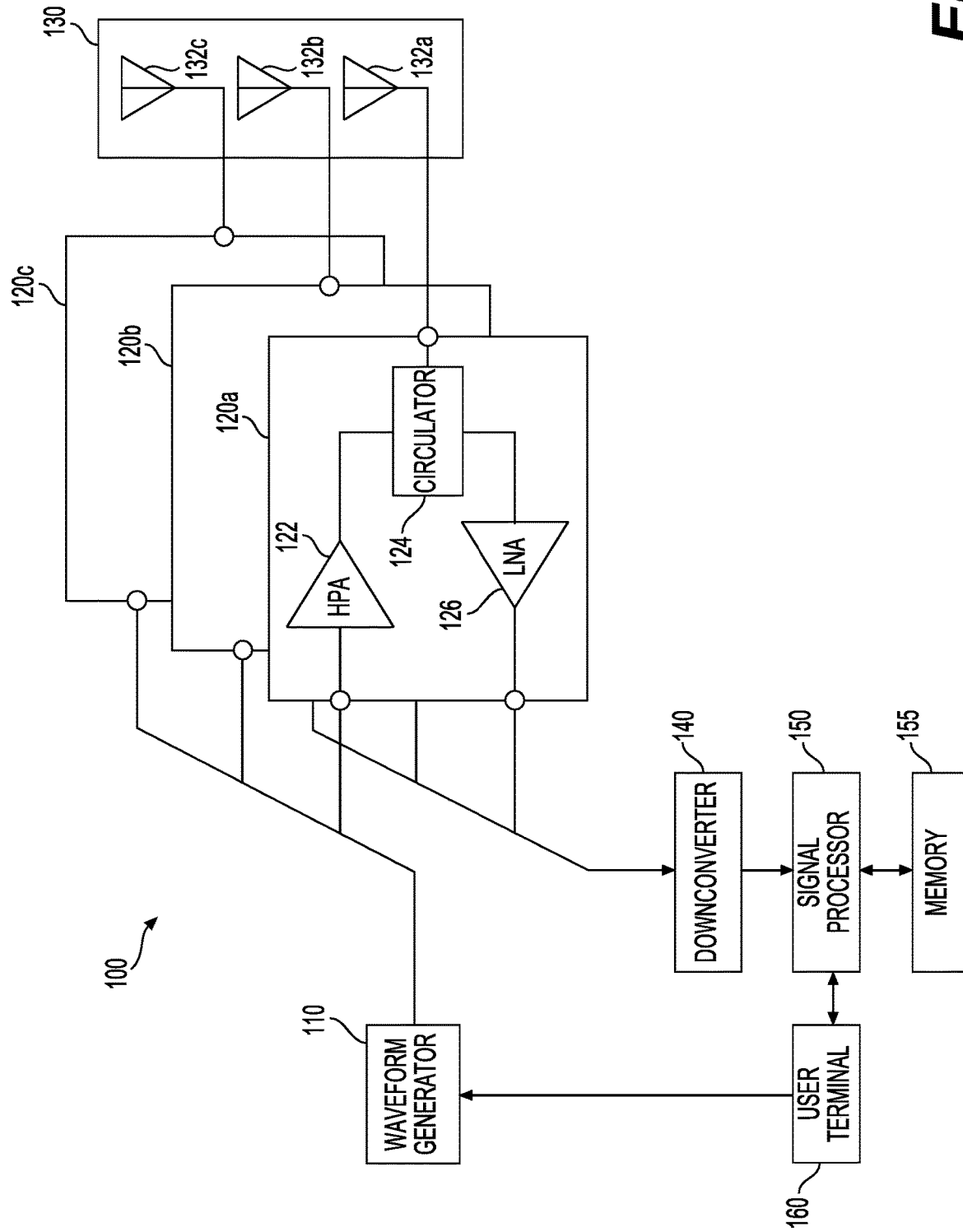
FIG. 1 is a block diagram of an example radar system according to embodiments of the disclosed subject matter.

The present inventive concept is best described through certain embodiments thereof, which are described in detail herein with reference to the accompanying drawings, wherein like reference numerals refer to like features throughout. It is to be understood that any use of the term invention, when used herein, is intended to connote the inventive concept underlying the embodiments described herein and not merely the embodiments themselves. It is to be understood further that the general inventive concept is not limited to the illustrative embodiments described herein, and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Traveling wave amplifiers can achieve wide bandwidths by combining each FET's input and output shunt capacitances with external inductances to form artificial transmission lines that connect the FETs' gates together and connect the FETs' drains together. As used herein, an "artificial transmission line" is an electrical network of lumped components that has a characteristic impedance, time delay, phase shift, or other characteristic of a transmission line. HPAs according to one or more embodiments of the disclosed subject matter can contain two artificial transmission lines. One artificial transmission line can connect the gate of the first FET to the gate of the second FET, and the second artificial transmission line can connect the drain of the first FET to the drain of the second FET. Since transmission lines generally are wide bandwidth structures, the frequency limiting effect of the FET's input and output shunt capacitances can be minimized, resulting in wideband amplification.

Wideband systems have numerous benefits over narrow band systems, but their performance at a given frequency is typically less than that of narrow band systems. This is because of the fundamental physical limitations on the performance of their wideband components. Embodiments described herein can be a wideband (e.g., 2 to 18 GHz), non-uniform distributed amplifier with high PAE across its band and especially high PAE across two sub-bands (e.g., 2 to 8 GHz and 16 to 18 GHz). The PAE in these sub-bands approaches that of a narrow-band amplifier.

FIG. 1 is a block diagram of an example radar system 100 according to embodiments of the disclosed subject matter. Radar system 100 may comprise a waveform generator 110, antenna modules 120a-120c, representatively referred to herein as antenna module(s) 120, an antenna array 130, a downconverter 140, a signal processor 150, and a user terminal 160. In typical operation, user terminal 160 may instruct or otherwise compel waveform generator 110 to produce one or more signals at its output in accordance with some transmission scheme. The signals can be distributed over antenna modules 120 for transmitting at each antenna element 132a-132c, representatively referred to herein as antenna element(s) 132 of antenna array 130. That is, at each antenna module 120, the signals from waveform generator 110 can be provided to a high power amplifier (HPA) 122, and the amplified signal can be provided to a corresponding antenna element 132 via a circulator 124, for instance. In certain embodiments, circulator 124 can be replaced with a transmit/receive switch.

The amplified signals may be transmitted into space and returned to antenna array 130 as radar return signals. The radar return signals can be provided to low-noise amplifier (LNA) 126 through circulator 124 at each antenna module 120, and can be downconverted by downconverter 140. The baseband data may be processed by signal processor 150 to, for example, identify objects (targets) from return signal data and to render informative graphics for presentation, such as on a display device (not illustrated) of user terminal 160. Return signal data may be stored in a memory 155 and retrieved for subsequent or additional processing.

In certain embodiments, the antenna module 120 can be mechanically attached to each antenna element 132 in an array antenna assembly. When so embodied, the antenna element/module assembly may be replaced as a unit. In other embodiments, antenna module 120 is separable as a unit from antenna element 132 and may be readily replaced, such as upon failure.

The radar embodiment described above is an apt environment in which to practice embodiments of the disclosed subject matter. However, radar, itself, is but one example of a more general class of radio frequency applications in which embodiments of the disclosed subject matter might be embodied. For example, a high power amplifier, or systems or methods thereof, embodied according to this disclosure, may be found in telecommunications systems as well.

Figure 2:
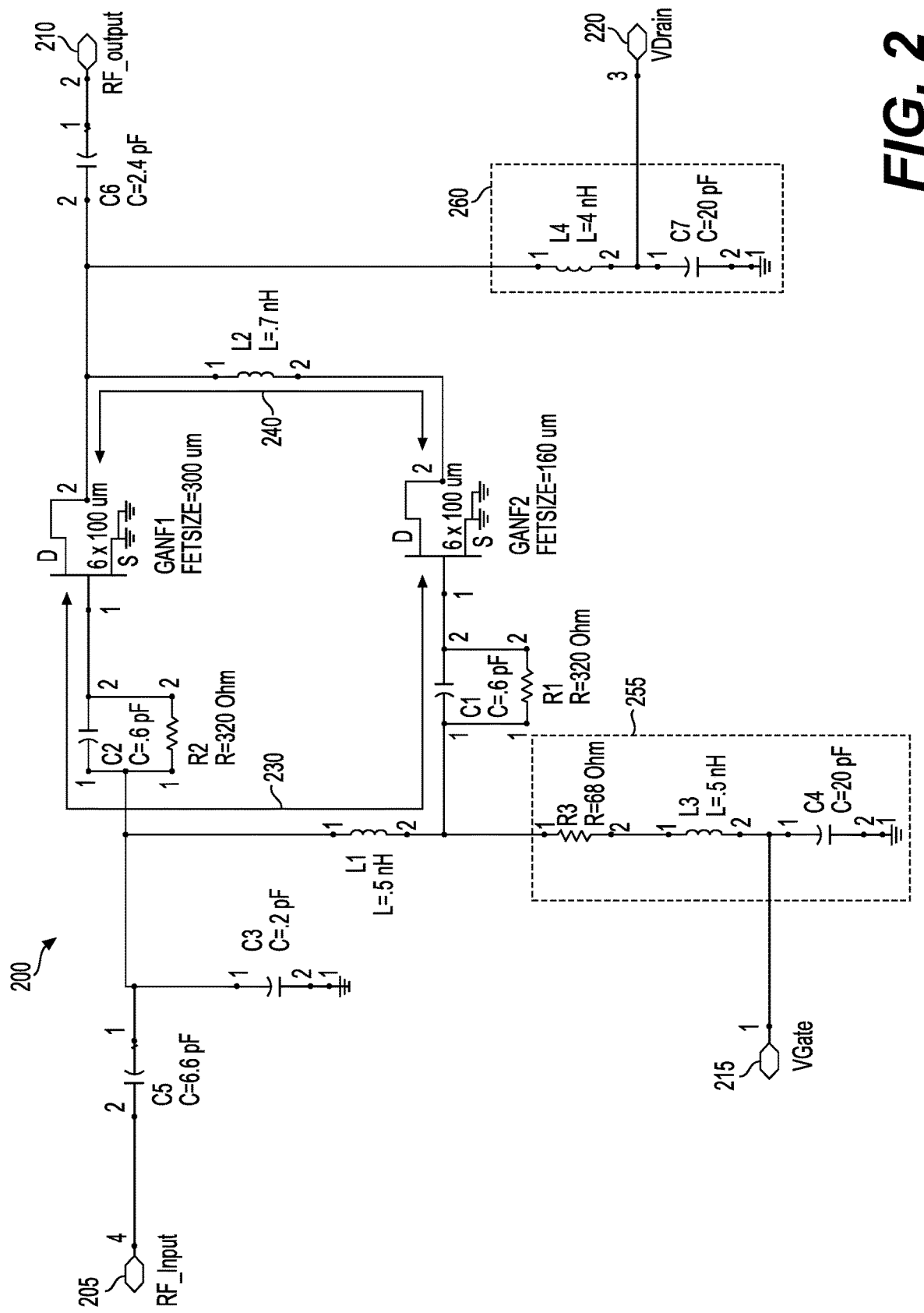
FIG. 2 is a schematic diagram of an exemplary distributed power amplifier according to embodiments of the disclosed subject matter.

FIG. 2 is a schematic diagram of an example HPA 200 according to embodiments of the disclosed subject matter. The values for the various components are merely examples.

The HPA 200 can have a radio frequency (RF) input terminal 205 and an RF output terminal 210. An RF input signal may be applied to RF input terminal 205, which can be coupled to a blocking capacitor C5, an impedance matching capacitor C3, a first artificial transmission line 230, and a gate termination 255, which may comprise resistor R3, inductor L3, and capacitor C4. The output terminal 210 can be coupled to a capacitor C6, for instance. Biases may be provided to HPA 200 through gate bias terminal 215 and through drain bias terminal 220.

First artificial transmission line 230 can connect the gate terminals of first FET GANF1 and second FET GANF2. Artificial transmission line 230 is comprised of the two FETs' input shunt capacitances, two series capacitors C1 and C2, and a spiral inductor L1. The FET shunt capacitances may be too large to be fully absorbed by the first artificial transmission line 230. The series capacitors C1 and C2 can thus be connected to respective gates of transistors first FET GANF1 and second FET GANF2, effectively reducing the shunt capacitances of the transistors FET GANF1 and FET GANF2 and allowing them to be resonated with a smaller inductance value than without such capacitors. At the node connecting the first of these series capacitors C2 to artificial transmission line 230, the RF input signal can split. A first portion of the RF input signal can be incident on first FET GANF1 and amplified. A second portion of the RF input signal can propagate along the spiral inductor L1 to the second FET GANF2 and amplified. To minimize reflections, the impedance of the first artificial transmission line 230 can match the real part of first FET GANF1's input impedance. However, the first FET GANF1's input impedance can be greater than can be realized in a transmission line, which can cause unwanted reflections. Gate termination 255 can thus be included to absorb these reflections and therefore to improve the HPA's input return loss.

As noted above, gate termination 255 can contain a relatively small spiral inductor L3 and a resistor R3 connected to RF ground through capacitor C4. Spiral inductor L3 can allow more input signal to be absorbed at the lower end of the band than at the upper end of the band. This can compensate for both FET's gain roll off with frequency, resulting in relatively flat HPA gain versus frequency. The input side of the HPA can have only a relatively minor influence on output power $P_{OUT}$ and PAE and, therefore, the gate termination 255 can be used to aid input return loss and gain slope without a large effect on $P_{OUT}$ and PAE. Gate bias can be supplied to the FET side of this bypass capacitor C4 at gate bias terminal 215. Resistors R1 and R2 can be connected across each series capacitor C1 and C2 to provide a DC path for the gate bias. The resistors R1, R2 may be of a relatively high value to realize a high resistance to the RF signals. DC voltage can be applied to the gates of both FETs GANF1 and GANF2 through the artificial transmission line's spiral inductor L1 and through the resistors R1 and R2.

The configuration of the drain or output side of the HPA can be set to achieve optimum output power $P_{OUT}$ and PAE. RF output of the first FET GANF1 propagates along a second artificial transmission line 240 to the output of the second FET GANF2, where the output power of these devices can be combined. The output signals can be in phase when combining, and the electrical delay of both artificial transmission lines 230 and 240 can control the phase of these signals. Optionally, according to one or more embodiments of the disclosed subject matter, the output signals must be in phase when combined. The second artificial transmission line 240 can transform the optimal real load impedance of first FET GANF1 to the reference plane of the second FET GANF2. For optimal HPA PAE and $P_{OUT}$, the resistive losses and mismatch loss of second artificial transmission line 240 should be minimized. Mismatch loss is minimized when the impedance of artificial transmission line 240 is similar to the first FET's optimal load impedance.

Embodiments according to the present disclosure can eliminate impedance matching problems typical in conventional GaN traveling wave amplifiers by not only increasing the periphery of the constituent FETs, but by also reducing the operating voltage of the constituent FETs such that an artificial transmission line, such as artificial transmission line 240 discussed above, can be constructed with an impedance similar to the optimal load pull impedance of second FET GANF2. A spiral inductor L2 combined with the shunt output capacitances of the two FETs can form this drain side artificial transmission line 240. The return loss between the first FET GANF1 and this artificial transmission line 240 can be better than 13 dB across the band. Thus, embodiments of the disclosed subject matter can operate at a reduced nominal drain voltage and provide the above-discussed impedance matching, whereas if the first FET GANF1 and the second FET GANF2 were operated at the nominal drain voltage of 20 VDC, for instance, this impedance match would not be possible.

In one example embodiment, the HPA 200 uses 0.15 µm GaN technology on a 4 mil SiC substrate and operates optimally with a drain voltage of 10 to 12 VDC. Such HPA 200 uses two FETs in a non-uniform distributed or traveling wave topology. Generally, non-uniform topologies contain FETs with different peripheries. As a non-limiting example, the first FET can have a 300 µm periphery and the second FET can have a 160 µm periphery. The FETs can be operated at 10 to 12 VDC instead of the typical 20 to 30 VDC, for instance. This reduced voltage can reduce the FET's optimal load pull impedance from 120 ohm-mm to 50 ohm-mm, for instance. The individual optimal load impedances for the 300 µm and 160 µm FETs are 167 ohms and 312 ohms, respectively. The load pull shunt capacitance $C_P$ is approximately 0.3 pF/mm which corresponds to 0.09 pF and 0.05 pF for the 300 µm and 160 µm FETs, respectively. These values can simultaneously provide high $P_{OUT}$ and high PAE.

The second artificial transmission line 240 can transform the output impedance of first FET GANF1 to the reference plane of second FET GANF2. This results in two real impedances effectively in parallel, i.e., 167 Ω in parallel with 312 Ω. The parallel combination is 108 Ω at the reference plane of second FET GANF2. This corresponds to a nearly 2:1 voltage standing wave ratio (VSWR) into a 50Ω load. A matching network including a DC drain bias network 260 may be added to improve the HPA's output return loss and $P_{OUT}$/PAE. It is to be noted that this matching network can exclude a resistive termination element.

Figure 3:
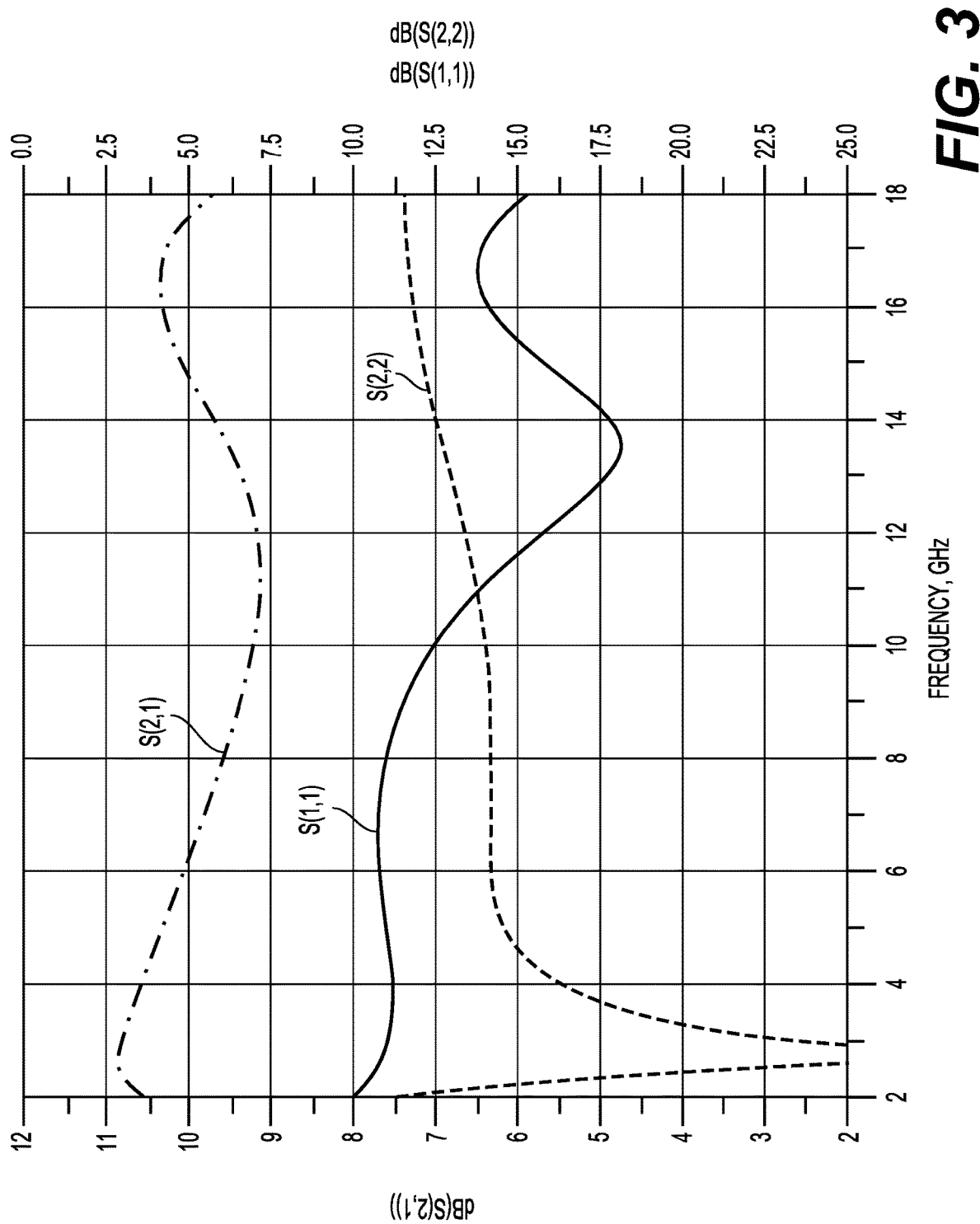
FIG. 3 is a graph illustrating the small signal gain and input/output return losses of the distributed amplifier illustrated in FIG. 2.

FIG. 3 is a graph illustrating the small signal gain and input/output return losses of the HPA 200 illustrated in FIG. 2. As illustrated in FIG. 3, gain S(2,1) is relatively flat with 10 dB ±1 dB of gain across the entire band. Input return loss S(1,1) and output return loss S(2,2) are better than 10 dB across the band. The HPA 200 was measured under pulsed and continuous wave (CW) conditions. For the pulsed condition, a 30% duty cycle and a 100 µs pulse width were used. The amplifier has 9 to 11 dB of gain, and an input/output return loss better than 10 dB across the full band.

Figure 4:
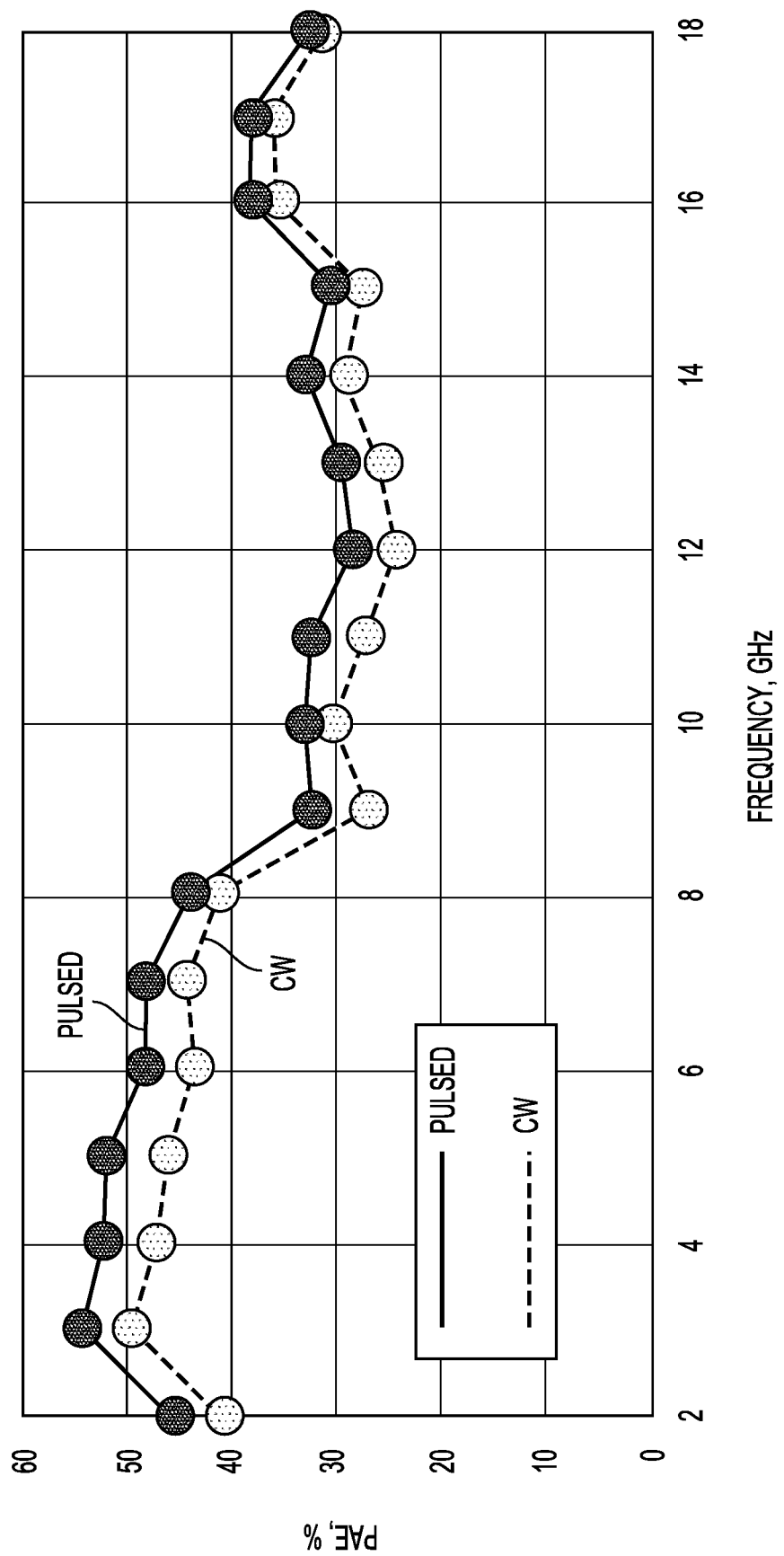
FIG. 4 is a graph illustrating maximum power-added efficiency in continuous wave operation and pulsed operation of the distributed amplifier illustrated in FIG. 2.

FIG. 4 is a graph illustrating maximum PAE in CW operation and pulsed operation with a 100 µsec pulse and 30% duty cycle. PAE ranges from 55% at the low end of the band, to 39% at the high end, to a low of 29% in the middle of the band. This wideband performance can be achieved without a drain termination (i.e., without a resistive element in the drain biasing network) that would degrade PAE. The HPA 200 can be inherently matched to the 50 Ω load under both small and large signal conditions, as is evident from its high output return loss and its enhanced PAE.

As noted above, the HPA 200 described can use 0.15 um GaN technology and operate typically from 10 to 12 VDC. This HPA 200 uses only two FETs, first FET GANF1 and second FET GANF2, a 300 um FET and a 160 um FET, respectively. These FETs can be operated at 10 to 12 VDC instead of the typical 20 to 30 VDC, which can reduce the FET's optimal load pull impedance. The parallel combination of the two FET impedances is near 50 ohms, thereby eliminating the need for a drain termination that may improve the output match but degrade PAE. The impedance level of the two FETs allows the ideal impedance level of the drain-side artificial transmission line that absorbs the output capacitances of the FETs and provides wide bandwidth to be realizable. Using only two FETs according to embodiments of the disclosed subject matter, such as first FET GANF1 and second FET GANF2, can further enhance PAE by eliminating the multiple long lengths of transmission lines or inductances that connect the outputs of these FETs. The lines or inductances may attenuate the signals as they propagate from the larger periphery FET to the output load.

Figure 5:
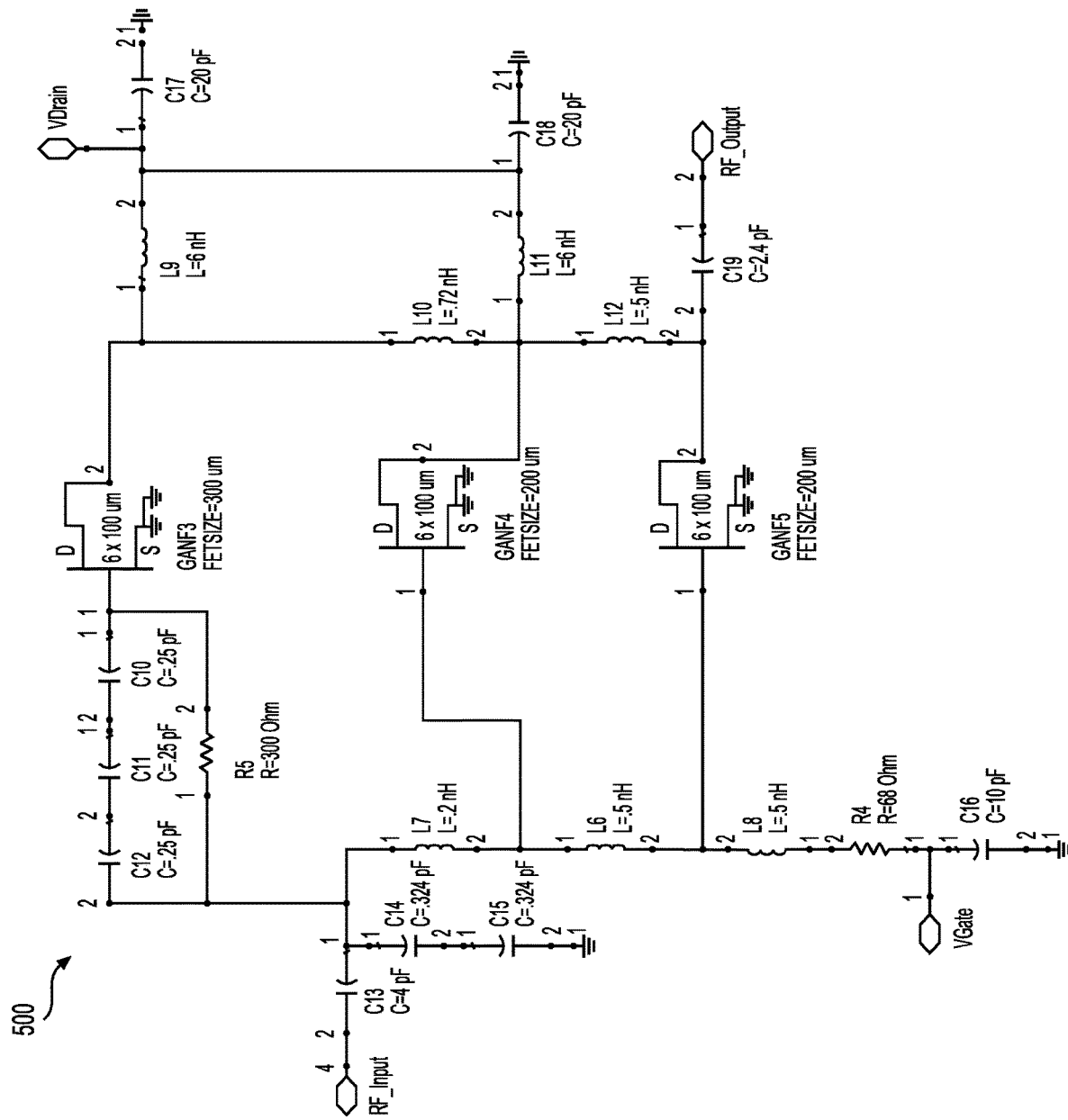
FIG. 5 is a schematic diagram of an exemplary three-FET distributed amplifier according to embodiments of the disclosed subject matter.

If more power is needed additional FETs can be added. For example, FIG. 5 is a schematic diagram of a three-FET distributed amplifier 500 according to embodiments of the disclosed subject matter.

Example distributed amplifier 500 can use a 300 µm FET GANF3 and two 200 um FETs GANF4 and GANF5 to output approximately 1 Watt at 10 VDC operation and has an 82 ohm output impedance, which is the parallel combination of 168 ohms from the 300 um FET GANF3 and two 255 ohm FET output impedances from the 200 um FETs GANF4 and GANF5. The 82 ohm impedance manifests as a 15 dB return loss in a 50 ohm system. This return loss for a wide bandwidth operation can be obtained by sizing the FETs properly and using low loss artificial transmission lines that match the required FET output impedances and absorb substantially all of the FETs output capacitance. Typically, distributed amplifiers may have output drain terminations to improve output return loss by absorbing output reflected energy, but by degrading the efficiency. Embodiments of the disclosed subject matter can avoid, i.e., omit, such drain terminations. Further, FET GANF3, FET GANF4, and FET GANF5 may be the only FETs of the amplifier 500.

In amplifier 500, an RF signal may be applied to an RF terminal RF Input and the amplified output may be provided at RF terminal RF Output. Gate bias may be applied through gate bias terminal VGate and a gate bias network comprised of inductor L8, resistor R4 and capacitor C16. Drain bias may be applied to drain bias terminal VDrain and provided to the drains of FETs GANF3-GANF5 through a biasing network comprised of inductors L9 and L11 and capacitors C17 and C18. It is to be noted that the drain biasing network includes two paths to prevent an overcurrent condition in inductor L10. It is to be noted further that the drain biasing network excludes a resistive element thereby improving the PAE of the amplifier.

The RF signal is provided to the gate of FET GANF3 through blocking capacitor C13 and capacitors C10-C12, which, as described above, reduces the shunt capacitance of FET GANF3. The shunt capacitances of GANF4 and GANF5 are sufficiently small to avoid the need for external series capacitors that reduce the overall shunt capacitance. The capacitors C14 and C15 serve as an impedance matching network and resistor R5 affords a DC path to the gate of GANF3. The gates of FETs GANF3-GANF5 are connected one to another through inductors L6 and L7, which, as discussed above, serve as inductive elements in corresponding artificial transmission lines that take into account the shunt capacitances of the FETs GANF3-GANF5. Similarly, the drains of FETs GANF3-GANF5 are interconnected via inductors L10 and L12, which serve as inductive elements in corresponding drain-side artificial transmission lines. The outputs of FETs GANF3-GANF5 are combined and provided to RF output terminal RF Output through DC blocking capacitor C19.

The technique described in this disclosure may be practiced as a method that first requires providing an apparatus for transmitting a radio frequency signal. Such an apparatus may be the radar system 100 of FIG. 1, a telecommunication system, or any system that amplifies RF signals for transmission. The method may include operating the apparatus to transmit the radio frequency signal. The apparatus may include a waveform generator, such as waveform generator 110, to generate the radio frequency signal and an antenna element, such as antenna element 132 of FIG. 1, to emit the radio frequency signal. The apparatus may further include a distributed power amplifier, such as distributed power amplifier 200 of FIG. 2 or distributed power amplifier 500 of FIG. 5, configured to amplify the radio frequency signal. The distributed power amplifier may include a radio frequency (RF) input terminal, such as terminal 205 of FIG. 2, and an RF output terminal, such as terminal 210 of FIG. 2. Additionally, the distributed power amplifier may include a first field effect transistor (FET), such as FET GANF1 in FIG. 2, coupled at a first gate terminal thereof to the RF input terminal 205, and coupled at a first drain terminal thereof to the RF output terminal 210. The first FET GANF1 can have a first periphery and a first source terminal electrically connected to ground potential. A second FET, such as FET GANF2 of FIG. 2, of the distributed power amplifier 200 can have a second periphery that is smaller than the first periphery, and a second gate terminal electrically coupled to the first gate terminal through a first inductor, such as inductor L1 of FIG. 2, a second drain terminal electrically coupled to the first drain terminal through a second inductor, such as inductor L2 of FIG. 2, and a second source terminal electrically connected to the ground potential. The distributed power amplifier can further include a drain voltage terminal, such as terminal 220 of FIG. 2, electrically coupled to a drain bias network, such as the circuit formed from inductor L4 and capacitor C7 in FIG. 2, through which a drain bias voltage is applied to the first drain terminal and the second drain terminal. In such a distributed power amplifier being operated according to the method presented herein, the drain bias network excludes a resistive element.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

The invention claimed is:

1. A distributed power amplifier comprising:
   a radio frequency (RF) input terminal and an RF output terminal;
   a first field effect transistor (FET) coupled at a first gate terminal thereof to the RF input terminal, and coupled at a first drain terminal thereof to the RF output terminal, the first FET having a first periphery and a first source terminal electrically connected to ground potential;
   a second FET having a second gate terminal electrically coupled to the first gate terminal through a first inductor, a second drain terminal electrically coupled to the first drain terminal through a second inductor, and a second source terminal electrically connected to the ground potential, wherein:
   the first FET and the second FET are in a non-uniform distributed topology with different peripheries, and
   the second FET has a second periphery that is smaller than the first periphery of the first FET; and
   a drain voltage terminal electrically coupled to a drain bias network through which a drain bias voltage is applied to the first drain terminal and the second drain terminal, the drain bias network excluding a resistive element.

2. The distributed power amplifier of claim 1, wherein the drain bias voltage is no greater than 12 VDC.

3. The distributed power amplifier of claim 1, wherein the first FET and the second FET are the only FETs in the distributed power amplifier.

4. The distributed power amplifier of claim 1, wherein the first FET and the second FET are GaN devices.

5. The distributed power amplifier of claim 4, wherein the first periphery is 300 μm and the second periphery is 160 μm.

6. The distributed power amplifier of claim 1, further comprising:
a third FET having a third periphery equal to the second periphery, and having a third gate terminal electrically coupled to the second gate terminal through a third inductor, a third drain terminal electrically coupled to the second drain terminal through a fourth inductor, and a third source terminal electrically connected to the ground potential.

7. The distributed power amplifier of claim 6, wherein the first FET, the second FET, and the third FET are the only FETs in the distributed power amplifier.

8. The distributed power amplifier of claim 6, wherein the first periphery is 300 μm and the second periphery is 200 μm.

9. An apparatus for transmitting a radio frequency signal, the apparatus comprising:
a waveform generator to generate the radio frequency signal;
an antenna element to emit the radio frequency signal; and
a distributed power amplifier configured to amplify the radio frequency signal, the distributed power amplifier including:
a radio frequency (RF) input terminal,
an RF output terminal,
a first field effect transistor (FET) coupled at a first gate terminal thereof to the RF input terminal, and coupled at a first drain terminal thereof to the RF output terminal, the first FET having a first periphery and a first source terminal electrically connected to ground potential,
a second FET having a second gate terminal electrically coupled to the first gate terminal through a first inductor, a second drain terminal electrically coupled to the first drain terminal through a second inductor, and a second source terminal electrically connected to the ground potential, wherein:
the first FET and the second FET are in a non-uniform distributed topology with different peripheries, and
the second FET has a second periphery that is smaller than the first periphery of the first FET, and
a drain voltage terminal electrically coupled to a drain bias network through which a drain bias voltage is applied to the first drain terminal and the second drain terminal, the drain bias network excluding a resistive element.

10. The apparatus of claim 9, wherein the drain bias voltage is no greater than 10 VDC.

11. The apparatus of claim 9, wherein the first FET and the second FET are the only FETs in the distributed power amplifier.

12. The apparatus of claim 9, wherein the first periphery is 300 μm and the second periphery is 160 μm.

13. The apparatus of claim 9, wherein the distributed power amplifier further includes:
a third FET having a third periphery equal to the second periphery, and having a third gate terminal electrically coupled to the second gate terminal through a third inductor, a third drain terminal electrically coupled to the second drain terminal through a fourth inductor, and a third source terminal electrically connected to the ground potential.

14. The apparatus of claim 13, wherein the first FET, the second FET, and the third FET are the only FETs in the distributed power amplifier.

15. The apparatus of claim 13, wherein the first periphery is 300 μm and the second periphery is 200 μm.

16. A method comprising:
providing an apparatus for transmitting a radio frequency signal; and
operating the apparatus to transmit the radio frequency signal,
wherein the apparatus comprises:
a waveform generator to generate the radio frequency signal;
an antenna element to emit the radio frequency signal; and
a distributed power amplifier configured to amplify the radio frequency signal, the distributed power amplifier including:
a radio frequency (RF) input terminal,
an RF output terminal,
a first field effect transistor (FET) coupled at a first gate terminal thereof to the RF input terminal, and coupled at a first drain terminal thereof to the RF output terminal, the first FET having a first periphery and a first source terminal electrically connected to ground potential,
a second FET having a second gate terminal electrically coupled to the first gate terminal through a first inductor, a second drain terminal electrically coupled to the first drain terminal through a second inductor, and a second source terminal electrically connected to the ground potential, wherein:
the first FET and the second FET are in a non-uniform distributed topology with different peripheries, and
the second FET has a second periphery that is smaller than the first periphery of the first FET, and
a drain voltage terminal electrically coupled to a drain bias network through which a drain bias voltage is applied to the first drain terminal and the second drain terminal, the drain bias network excluding a resistive element.

17. The method of claim 16, wherein the drain bias voltage is from about 10 VDC to about 12 VDC.

18. The method of claim 16, wherein the first FET and the second FET are the only FETs in the distributed power amplifier.

19. The method of claim 16, wherein the first periphery is 300 μm and the second periphery is 160 μm.

20. The method of claim 16, wherein the distributed power amplifier further includes:
a third FET having a third periphery equal to the second periphery, and having a third gate terminal electrically coupled to the second gate terminal through a third inductor, a third drain terminal electrically coupled to the second drain terminal through a fourth inductor, and a third source terminal electrically connected to the ground potential,
wherein the first FET, the second FET, and the third FET are the only FETs in the distributed power amplifier.

* * * * *